United States Patent [19]

Tomita et al.

[11] Patent Number: 4,633,085
[45] Date of Patent: Dec. 30, 1986

[54] TRANSMISSION-TYPE ELECTRON MICROSCOPE

[75] Inventors: Takeshi Tomita; Yoshiyasu Harada; Kimio Ohi, all of Tokyo, Japan

[73] Assignee: JEOL Ltd., Tokyo, Japan

[21] Appl. No.: 722,778

[22] Filed: Apr. 12, 1985

[30] Foreign Application Priority Data

Apr. 17, 1984 [JP] Japan .................................. 59-77110

[51] Int. Cl.⁴ .................. H01J 37/141; H01J 37/252; H01J 37/26
[52] U.S. Cl. .................................... 250/311; 250/310; 250/396 ML
[58] Field of Search ................ 250/311, 310, 396 ML, 250/396 R, 398

[56] References Cited

U.S. PATENT DOCUMENTS

| | | | |
|---|---|---|---|
| 3,717,761 | 2/1973 | Koike et al. | 250/310 |
| 3,924,126 | 12/1975 | Anderson et al. | 250/311 |
| 4,219,732 | 8/1980 | Nakagawa et al. | 250/396 ML |

Primary Examiner—Bruce C. Anderson
Assistant Examiner—Jack I. Berman
Attorney, Agent, or Firm—Webb, Burden, Robinson & Webb

[57] ABSTRACT

An electron microscope having plural stages of focusing lenses between an objective lens and an electron gun. The magnetic pole piece of the focusing lens of the final stage which is on the side of the objective lens takes a conic form which tapers toward the objective lens. The yoke of the objective lens on the side of the focusing lenses is centrally provided with a conic recess. This structure makes it possible to shorten the distance between the position of the magnetic field produced by an auxiliary lens and the front focal point defined by a front objective lens without introducing interference between the focusing lens of the final stage and the object lens proper. Thus, the observation of an electron micrograph covering a wide field of view facilitates accurate analysis of the physical properties of a designated microscopic region on a specimen.

3 Claims, 5 Drawing Figures

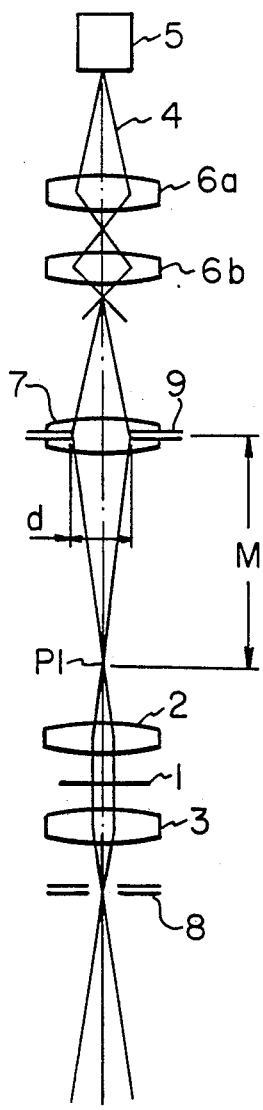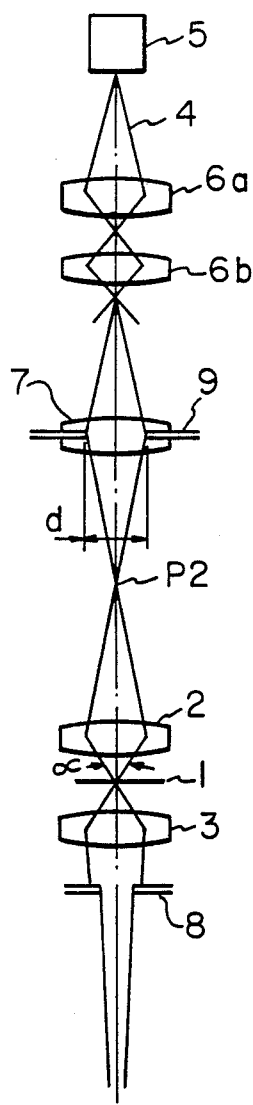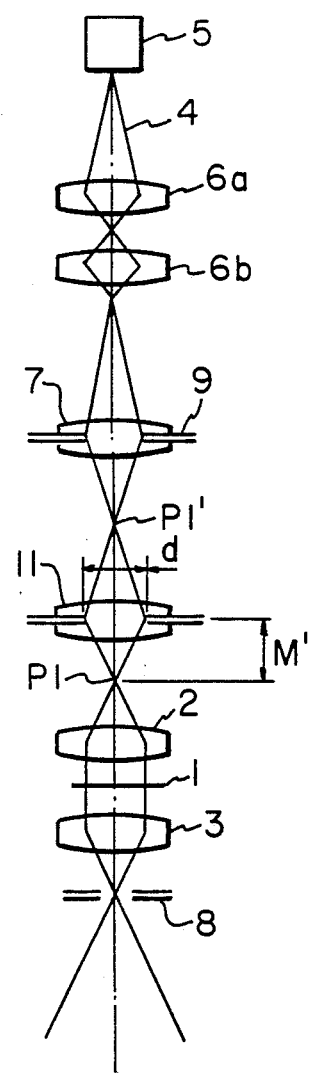
Fig. 1
(PRIOR ART)
Fig. 2
(PRIOR ART)
Fig. 4

TRANSMISSION-TYPE ELECTRON MICROSCOPE

BACKGROUND OF THE INVENTION

The present invention relates to improvements in the electron lens system of a transmission-type electron microscope.

In recent years, it has become increasingly important for transmission-type electron microscopes to permit analysis of the physical properties of microscopic regions in a microscope image derived from a sample, as well as observation of the microscope image. In order to make possible such an analysis, it is necessary that a sufficiently large current, or illuminance, of electron beam is given to the microscopic region on the sample that is irradiated with the electron beam focused to a size of several nanometers to tens of nanometers on the sample. Thus, a lens exhibiting only a small spherical aberration is required to be used for the focusing lens at the final stage which contributes to the focusing of the electron beam. If the excitation to the objective lens were varied between the observation of a micrograph and the analysis of a microscopic region, it would be difficult to make their fields of view correspond to each other. Hence, it is also necessary that the objective lens is excited constantly, whether the observation or the analysis is made. In order to observe specimens while satisfying these requirements, the specimens have been conventionally placed in a so-called condense objective position within the magnetic field that is produced by the strongly energized objective lens.

FIG. 1 is a schematic diagram showing the electron beam path in a conventional (prior art) electron microscope. The optical analogs of electron lens are used schematically in the drawings. A specimen 1 is placed in the condense objective position defined by an objective lens 2, 3, and which is put in transmission electron microscopy (TEM) mode. FIG. 2 is a diagram similar to FIG. 1 except that the microscope is put in analysis mode. In these two figures, a filmy specimen 1 to be examined is placed in the magnetic field set up by the objective lens, which can be considered to be composed of a front objective lens 2 disposed above the specimen 1 and a rear objective lens 3 disposed below the specimen 1. These lenses can either project the infinitely remote point above the specimen onto the specimen or converge the electron beam transmitted through the specimen at the infinitely remote point below the specimen without varying the excitation to the objective lenses. The electron beam 4 that is to be directed to the specimen 1 is emitted by an electron gun 5 in a divergent manner. The beam 4 is focused by first, second, third focusing lenses 6a, 6b, 7, respectively, and the front objective lens 2 in turn. The electron beam transmitted through the specimen 1 passes through an objective lens aperture plate 8 and is directed into an imaging lens system (not shown) containing intermediate lenses.

In the TEM mode shown in FIG. 1, the electron beam 4 is caused by the focusing lens 7 to produce a crossover image of the electron gun 5 at the front focal point P1 defined by the front objective lens 2. The beam diverging from the crossover image is made parallel to the optical axis by the front objective lens 2 before it falls on the specimen 1. At this time, the extent of the specimen region irradiated by the parallel electron beam depends on the distance M between a lens aperture plate 9 provided in the second focusing lens 7 and the focal point P1 and also on the diameter d of the aperture formed in the aperture plate 9. The electron beam transmitted through the specimen 1 is focused at the position of the objective lens aperture plate 8 by the rear objective lens 3. The aperture plate 8 is disposed in the back focal plane defined by the lens 3. After passing through the aperture plate 8, the beam is directed into the imaging lens system (not shown), which is so adjusted that the intermediate lens and other elements form an electron microscope image. Thus, an electron microscope image due to the transmitted beam is formed on a fluorescent plate (not shown).

In the TEM mode described above, the specimen image on the fluorescent plate is observed, and a location to be analyzed is found in it. Then, a specimen-moving device (not shown) is operated so that the position of the specimen may be moved relative to the electron beam. The specimen-moving device is adjusted until the location of the image to be investigated is brought to the center of the fluorescent plate, i.e., the optical axis.

After the specimen is set in this way, the lens system is switched to the analysis mode shown in FIG. 2, in which the focusing lenses cause the electron beam 4 to make a crossover image of the electron gun 5 at a point P2 that is sufficiently remote from the front objective lens 2 above the lens 2 to be regarded as infinitely remote. This crossover image is projected onto the specimen 1 to a reduced scale by the front objective lens 2. The divergence angle $\alpha$ of the beam is determined by the diameter d of the aperture in the aperture plate 9 in the second focusing lens 7. The electron beam transmitted through the specimen passes through the aperture plate 8 and is guided into the imaging lens system which has been adjusted so as to form a diffraction pattern. Thus, a diffraction pattern is presented on the fluorescent plate. Otherwise, the beam transmitted through the specimen is directed into an energy analyzer to make analysis of the energies of the transmitted beam or to detect the X-rays emitted from the specimen for elemental analysis. It is also possible to provide deflection coils above the objective lenses, the coils being supplied with a scan signal. The surface of the specimen is scanned by the electron beam under the control of the coils. A signal acting to modulate the brightness, or the intensity, or a cathode-ray tube in synchronism with the scanning of the beam is affected by the secondary electrons emitted from the specimen. Hence, the secondary electrons can be detected as the modulating signal. In this case, the instrument is employed as a scanning-type electron microscope.

The prior art instrument is switched between the TEM mode and the analysis mode in the manner described above. The problem with this instrument is that the field of view which can be observed in the TEM mode is quite narrow. This field of view may be broadened either by increasing the diameter d of the aperture in the aperture plate 9 in the third focusing lens, generally the focusing lens at the final stage, or by minimizing the distance M between the lens aperture plate 9 and the front focal point P1 defined by the front objective lens. However, as the divergence angle of the electron beam emitted from the electron gun is increased, the current density is reduced. For the above and other reasons, it is impossible to increase the diameter d of the aperture beyond a certain limit. In an attempt to make the distance M as short as possible, the provision of an additional lens between the second focusing lens and the front objective lens has been proposed as disclosed in U.S. Pat. No. 4,306,149. In this proposed system, the distance M can be made short but the additional auxiliary lens makes use of the yoke itself of the objective lens proper, leading to an undesirable situation. In particular, when the excitation to the auxiliary lens is varied, the intensity of the magnetic field produced above and below the specimen changes. Accordingly, if the instrument is switched between the TEM mode and the analysis mode, the axes will not coincide with each other. Consequently, the fields of view will not precisely correspond to each other.

SUMMARY OF THE INVENTION

It is an object of the present invention to provide an electron microscope capable of making rapid and accurate analysis of the physical properties of microscopic regions in a specimen.

It is another object of the invention to provide an electron microscope that can offer a wider field of view for observation while keeping the correspondence between the TEM mode and the analysis mode without changing the excitation to the objective lens.

It is a further object of the invention to provide an electron microscope in which the distance M between the position of the magnetic field produced by an auxiliary lens and the focal point defined by the front objective lens is made short without introducing interference between the auxiliary lens disposed close to the objective lens and the objective lens proper.

These objects are achieved by an instrument which has plural stages of focusing lenses between an object lens and an electron gun, and in which the magnetic pole piece of the focusing lens at the final stage that is on the side of the objective lens takes a conic shape tapering toward the objective lens. The yoke of the objective lens which is on the side of the focusing lenses is provided with a conic recess opening toward the focusing lens.

BRIEF DESCRIPTION OF THE DRAWINGS

FIG. 1 is a schematic diagram of a conventional transmission-type electron microscope, for showing the electron beam path in the transmission electron microscopy (TEM) mode;

FIG. 2 is a diagram similar to FIG. 1, but in which the microscope is put in the analysis mode;

FIG. 4 is a schematic diagram showing the electron beam path in the microscope of FIG. 3 in the TEM mode.

PREFERRED EMBODIMENT OF THE INVENTION

Figure 3:
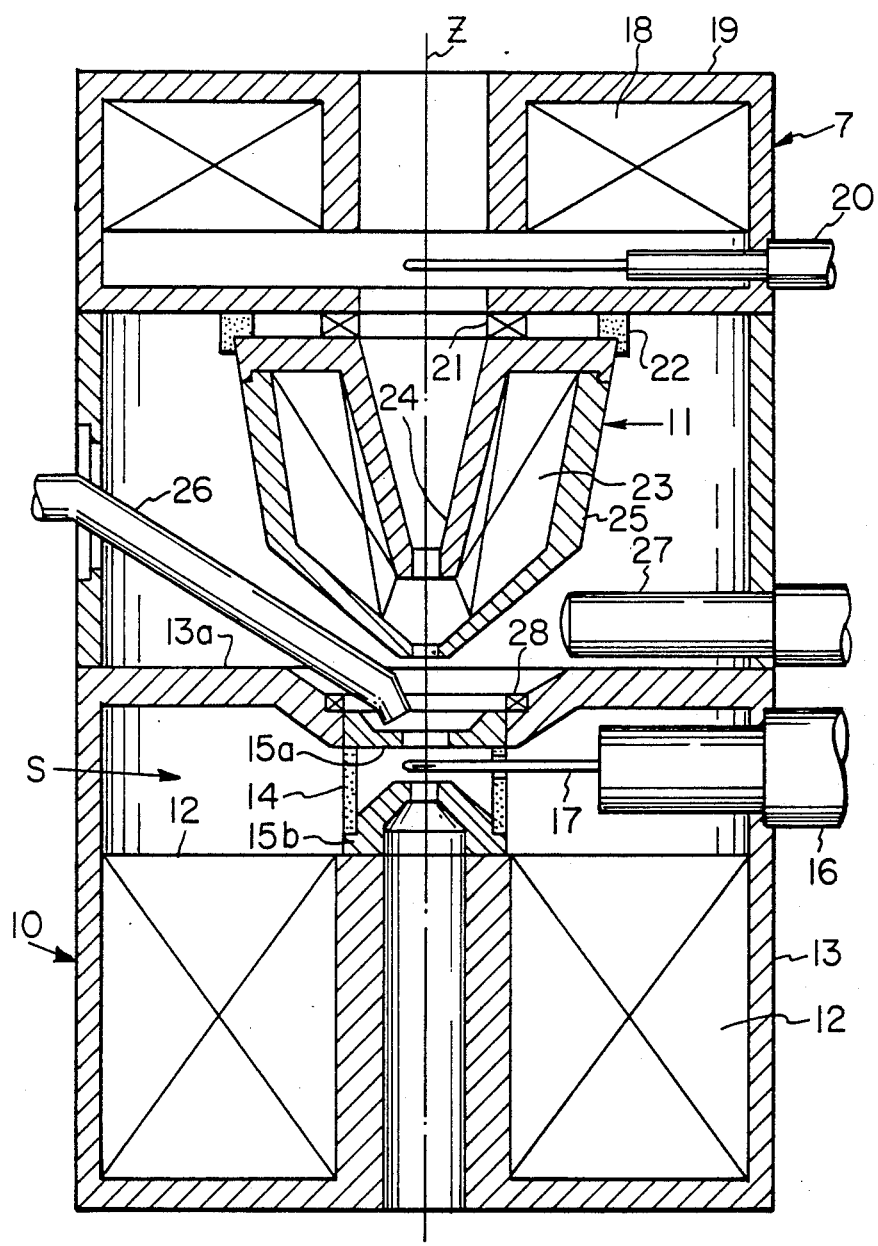
FIG. 3 is a schematic view of an electron microscope according to the present invention.

Referring to FIG. 3, there is shown an electron microscope according to the present invention in cross section. This instrument includes a third focusing lens 7 and an objective lens 10 both of which are disposed symmetrically with respect to optical axis z. An auxiliary focusing lens 11 constituting the final stage is disposed between the lenses 7 and 10. The objective lens 10 is composed of a lens coil 12, a lens yoke 13 surrounding the coil 12, and two magnetic pole pieces 15a and 15b disposed inside the yoke. The pole pieces are coupled together by a nonmagnetic spacer 14.

A space S is formed between the coil 12 and an upper lens yoke 13a that is disposed on the side of the focusing lens. A specimen-moving device 16 and an objective lens aperture plate mechansim (not shown) extend through the lens yoke 13 into the space S. Mounted at the front end of the specimen-moving device 16 is a specimen holder 17 extending through a hole formed in the spacer 14. The holder 17 acts to place a specimen substantially at the intermediate position between the pole pieces 15a and 15b. The specimen-moving device 16 has a mechanism for moving the specimen in a plane perpendicular to the optical axis z. The device 16 is further provided with a tilt mechansim for rotating the specimen about the axis of the specimen holder 17. When the tilt mechansim is operated, the whole specimen-moving device 16 rotates about the axis of the holder 17, together with the holder 17. To permit this rotary motion, the space S must extend above the lower end of the upper pole piece 15a.

According to the present invention, the upper yoke (plus the upper pole piece 15a) is centrally provided with a recess to allow the extension into the space S. The condense objective position in the objective lens structure is located at a higher position that is in close proximity to the focusing lens. In general, when the objective lens is excited strongly, large magnetic flux flows through the lens yoke. Under this condition, the yoke nearly saturates magnetically and large amounts of magnetic flux leaks from the yoke. Therefore, as shown in FIG. 3, the upper yoke 13a is tilted upward such that it is the greatest possible distance apart from the magnetic pole piece. That is, a recess is formed in the upper surface of the upper lens yoke 13a to thereby reduce the leakage flux from the yoke.

The third focusing lens 7 consists of a lens coil 18 and a yoke 19. A stop (baffle) mechanism 20 inserts a stop into the center of the magnetic field produced by the lens 7.

A focusing, auxiliary lens 11 constituting the final stage is mounted to the lower surface of the third lens 7 via a deflection coil 21 and a retainer 22. The auxiliary lens 11 is composed of a lens coil 23, an upper yoke 24, and a lower yoke 25. The lower yoke 25 takes a conic form taking off the object lens. (In other words, the conic yoke tapers toward the objective lens.) Similarly, the upper magnetic pole piece 24 is shaped like a cone that protrudes downward. Therefore, the magnetic field produced between the peripheral surfaces of the two yokes 24, 25 acts like a lens and is located at the lowermost position within the auxiliary lens. Consequently, the position of the main lens surface of the auxiliary lens structure can be located closer to the objective lens.

In this way, the lenses are arranged in such a way that a gap of a substantially uniform width is formed between the auxiliary lens 11 and the upper yoke 13a of the objective lens. The X-ray detector 26, the secondary electron detector 27, the deflection coils 28, etc. of an X-ray analyzer can be mounted in the gap. This arrangment of the X-ray detector 26 in the gap increases the angle at which the X-ray emanating from the specimen 1 falls on the detector. This is favorable to X-ray analysis.

Figure 5:
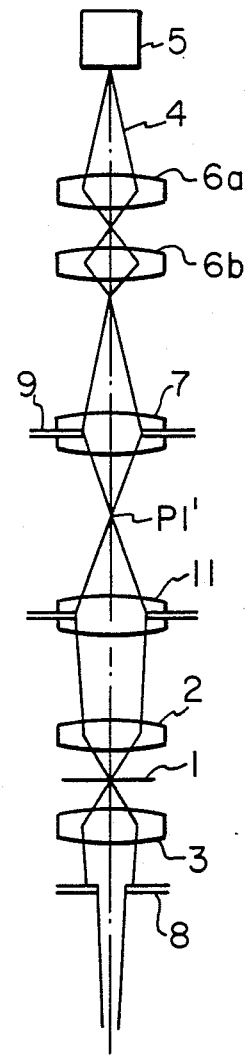
FIG. 5 is a schematic diagram showing the electron beam path in the microscope of FIG. 3 in the analysis mode.

FIGS. 4 and 5 are diagrams similar to FIGS. 1 and 2, but showing the electron optics system of the instrument shown in FIG. 3 when it is put in the TEM mode and in the analysis mode, respectively.

In the TEM mode shown in FIG. 4, the third focusing lens 7 forms a crossover image at a position P1' lying about the auxiliary lens 11. This crossover image is focused by the auxiliary lens 11 at the front focal point P1 defined by the front objective lens 2. In this way, the crossover image which is formed at the position P1' by the electron beam exhibiting a large divergence angle can be brought to the position P1 at a substantially 1:1 relation. Hence, the specimen region irradiated by the electron beam can be made much broader than in the case of the conventional instrument of FIG. 1. However, the optical system of the instrument of FIG. 3 in the analysis mode is fundamentally the same as the conventional optical system shown in FIG. 2. That is, the auxiliary lens 11 is excited weakly than in the TEM mode shown in FIG. 5, and it is possible to reduce the excitation further, even down to zero.

By making and arranging the objective lens and the preceding, final-stage focusing auxiliary lens in the manner as described above according to the present invention, the instrument can be switched between the TEM mode and the analysis mode while keeping the correspondence between the sample positions that are irradiated in the TEM mode and the analysis mode, respectively, without changing the excitation to the objective lens. In addition, the field of view of electron micrographs in the TEM mode can be rendered much broader than conventional. Consequently, the analysis of the physical properties of microscopic regions in a specimen using the microscope can be made more rapidly and accurately.

We claim:

1. In a transmission-type electron microscope having a TEM mode and an analysis mode said microscope including an objective lens, an electron gun for emitting an electron beam, and a plurality of stages of focusing lenses mounted therebetween, the focusing lens of the final stage which is on the side of the objective lens having a yoke leg which is on the side of the objective lens taking a conic form which tapers toward the objective lens, and the objective lens having a yoke leg which is on the side of the focusing lenses being provided with a centrally positioned conic recess, said objective lens yoke leg not being shared with another lens whereby in the TEM mode the final stage focusing lens may be adjusted independently of the objective lens to form the electron beam at about the back focal plane of the objective lens in the TEM mode and for providing minimum focusing during the analysis mode.

2. The transmission-type electron microscope of claim 1, wherein a specimen to be investigated is placed substantially at the intermediate position between the two magnetic pole pieces of the objective lens.

3. The transmission-type electron microscope of claim 1, further comprising a means which extends into a gap formed between the yoke leg of the focusing lens of the final stage which is on the side of the objective lens and the yoke leg of the objective lens which is on the side of the focusing lens, to detect the X-rays, secondary electrons, or reflected electrons from the specimen.

* * * * *